(12) United States Patent
Taniguchi et al.

(10) Patent No.: US 6,175,534 B1
(45) Date of Patent: Jan. 16, 2001

(54) SYNCHRONOUS SEMICONDUCTOR STORAGE DEVICE

(75) Inventors: Junya Taniguchi; Yasuji Koshikawa; Kouji Mine, all of Tokyo (JP)

(73) Assignee: NEC Corporation, Tokyo (JP)

( * ) Notice: Under 35 U.S.C. 154(b), the term of this patent shall be extended for 0 days.

(21) Appl. No.: 09/299,839

(22) Filed: Apr. 26, 1999

(30) Foreign Application Priority Data

Apr. 27, 1998 (JP) .................................................. 10-117402

(51) Int. Cl.[7] ....................................................... G11C 8/00
(52) U.S. Cl. ............................................ 365/233; 203/201
(58) Field of Search ................................... 365/201, 203, 365/233

(56) References Cited

U.S. PATENT DOCUMENTS 5,587,950 * 12/1996 Sawada et al. ...................... 365/201
5,905,690 * 5/1999 Sakurai .................................. 365/233

* cited by examiner

*Primary Examiner*—Huan Hoang
(74) *Attorney, Agent, or Firm*—Darryl G. Walker

(57) ABSTRACT

According to one disclosed embodiment, a synchronous semiconductor storage device (100) includes a circuit for accomplishing mode setting operations after a test mode is entered, where the test mode includes a higher frequency internal clock. A synchronous semiconductor storage device (100) generates a first internal synchronous clock signal ICLK which can be used to enter mode setting values to a mode register setting circuit (122). At the same time, an external synchronous signal CSB can be applied to generate a second internal synchronous clock signal CSCLK. The ICLK and CSCLK values can be used to generate a higher frequency clock ICLK' in a test mode. The ICLK' signal can be applied to internal circuits (124) allowing such circuits to operate at a higher speed. The ICLK' signal is not applied to the mode register setting circuit (122), thereby avoiding the possible latching of incorrect mode setting values by the mode register setting circuit (122).

20 Claims, 6 Drawing Sheets

SYNCHRONOUS SEMICONDUCTOR STORAGE DEVICE

TECHNICAL FIELD

The present invention relates generally to semiconductor storage devices, and more particularly to synchronous semiconductor storage devices that receive external inputs signals synchronously with an external clock signal.

BACKGROUND OF THE INVENTION

Many types of integrated circuits, including conventional synchronous semiconductor storage devices, are subject to various types of testing. One type of reliability test is an accelerated (burn-in) test. Burn-in tests are typically carried out after a device in "die" form has been assembled into a package. To reduce the time required to conduct burn-in testing, it is known to test a number of semiconductor storage devices in parallel. Unfortunately, due to the high load presented by multiple parallel devices, testing signals applied to the devices have a relatively low frequency. Thus, the parallel testing of synchronous storage devices can be more problematic than asynchronous semiconductor storage devices, as it can take a relatively long time to access the memory cells. Longer testing times can result.

Referring now to FIG. 6, a schematic diagram is set forth illustrating a conventional synchronous semiconductor storage device. A portion of a synchronous semiconductor storage device is designated by the general reference character 600, and is shown to include a number of control input receivers 602-A to 602-D, each of which receives corresponding control signals (shown as RASB, CASB, WEB, and ADD). In response to the various control signals (RASB, CASB, WEB, and ADD), the control input receivers (602-A to 602-D) apply corresponding internal signals to mode register setting circuit 604. According to a predetermined set of internal signals, the mode register setting circuit 604 can generate a test mode activating signal (TEST_MODE).

Also set forth in FIG. 6 is a clock signal input receiver 606 and a select signal input receiver 608. The clock signal input receiver 606 is shown to receive a clock signal CLK while the select signal input receiver 608 is shown to receive a select signal CSB. The output of the clock input receiver 606 is applied to a pulse generator circuit 610 that generates an internal clock signal ICLK. The output of the select input receiver 608 is applied to another pulse generator circuit 612 to generate an internal select signal CSCLK. The output of the select input receiver 608 is also applied as an input to an OR gate 614. The OR gate 614 also receives the TEST_MODE signal as another input.

The pulse generator circuit 612 also receives the TEST_MODE signal. In the particular arrangement of FIG. 6, the TEST_MODE signal enables the pulse generator circuit 612.

The outputs of pulse generator circuits 610 and 612 (the ICLK and CSCLK signals) are applied as inputs to an OR gate 618. The output of OR gate 618 is another clock signal ICLK'. The ICLK' signal is applied to the mode register setting circuit 604 as well as other internal circuits 616.

When a test mode is entered (TEST_MODE is activated), the ICLK' signal is generated by the CLK signal pulsing high and the CSB signal pulsing high. A first ICLK pulse is generated by pulse generating circuit 610. A second CSCLK pulse is generated by pulse generating circuit 612. An OR gate combines the two pulses to generate an ICLK' signal that pulses at twice the frequency of the memory tester (pulses twice the frequency of the CLK signal as applied during bun-in). In this way, an ICLK' signal can be generated for those circuits that would otherwise receive the ICLK signal in a non-test mode. This allows for faster testing, thereby overcoming the slow testing arising out of conventional parallel testing approaches.

It is noted that in a non-test mode (TEST_MODE signal inactive), the ICLK' signal includes pulses generated synchronously with the CLK signal, as pulse generating circuit 612 will be disabled. The ICLK' signal is then applied to internal circuits 616 and mode register setting circuit 604 to control the timing of such circuits.

While the conventional approach of FIG. 6 is capable of generating an internal clock signal ICLK' having a frequency faster than that of an applied external clock signal CLK, such an arrangement can have drawbacks. In many synchronous semiconductor storage devices it is necessary to execute a mode register setting operation to initialize a device after power has been applied to the device. Such an operation involves applying a particular set of signals (e.g., RASB, CASB, WEB or ADD) on the rising edge of a clock signal (CLK).

A drawback to the approach illustrated by FIG. 6 can best be understood with reference to a timing diagram set forth in FIG. 7. FIG. 7 illustrates the responses of the CLK, CSB, ICLK', RASB, CASB, WEB, and ADD signals. In the operation illustrated by FIG. 7, the CSB signal transitions low before the mode register has been set. With the CSB signal low, the CLK signal then transitions high. In response to the transition of the CLK signal, the ICLK signal is pulsed high by the pulse generator 610. The ICLK pulse is translated into a first ICLK' pulse by OR gate 618. The first ICLK' pulse latches the RASB, CASB, WEB and ADD values. The latched RASB, CASB, WEB and ADD signals will place the device in the desired mode of operation. However, due to the advantageous "double frequency" capability of the circuit, a second ICLK' high-going transition in the CSB signal. By the time the second ICLK' pulse transitions high, the RASB, CASB, WEB and ADD values have changed. Consequently, the second ICLK' pulse latches unintended RASB, CASB, WEB and ADD values in a mode register setting circuit, placing the device in an unintended mode of operation.

The latching of unintended mode setting values can be particularly problematic if the device is in a test mode. For example, if a device is placed in a test mode after applying power to the device, it is desirable to be able to take the device out of the test mode by applying a combination of mode setting signals (RASB, CASB and WEB) that indicate a non-test mode. However, if the CSB signal is shifted to transition high immediately after the application of a mode register setting command, but prior to the transmission of non-test mode control signal values, erroneous latching of mode setting values can take place. Therefore, while an approach such as that set forth in FIG. 6 can provide for advantageously fast test clock signals, such an approach can also provide disadvantageous results for mode register setting circuits and the like.

SUMMARY OF THE INVENTION

It is an object of the present invention to provide a synchronous semiconductor device that can shorten a test time when used in a tester having a relatively low clock frequency, and also transition to a desired mode of operation after entering a test mode of operation.

According to the disclosed embodiments, a synchronous semiconductor storage device can include a first input receiver for receiving a first external clock signal and a second input receiver for receiving a second external clock signal. A first pulse generating circuit receives the output of the first input receiver and provides a first internal synchronous signal in response thereto. A second pulse generating circuit receives the output of the second input receiver and provides a second internal synchronous signal in response thereto. A logic gate generates a third internal synchronous signal in response to the outputs of the first input receiver and the second input receiver. In a test mode, a mode register setting circuit can output an active test mode activating signal synchronously with the first internal synchronous signal. An internal circuit receives the third internal synchronous signal.

According to one aspect of the embodiments, when the test mode activating signal is not active, an internal circuit operates synchronously with the first internal synchronous signal. When the test mode activation signal is active, at least one part of the internal circuit operates synchronously with the first synchronous signal, while another part of the internal circuit operates synchronously with the third internal synchronous signal.

According to another aspect of the embodiments, while a synchronous semiconductor storage device is being tested it can receive at least an active command and a precharge command as inputs. The synchronous semiconductor storage device can include an active control circuit, for controlling an internal circuit portion in response to the input of an active command, and a precharge control circuit, for controlling an internal circuit portion in response to the input of a precharge command. Once a test mode activating signal is active, the active control circuit can operate synchronously with a first internal synchronous signal and a third internal synchronous signal. The precharge control circuit can operate synchronously with the first internal synchronous signal.

According to another aspect of the embodiments, when a test mode activating signal is not active, a synchronous semiconductor storage device includes at least one internal circuit portion that is controlled according to a high or low level output from a second input receiver. When a test mode activating signal is active, at least one internal circuit portion is controlled, irrespective of the high or low level output from the second input receiver.

DETAILED DESCRIPTION OF THE EMBODIMENTS

An embodiment of a synchronous semiconductor storage device will now be described with reference to FIGS. 1 to 3.

Figure 1:
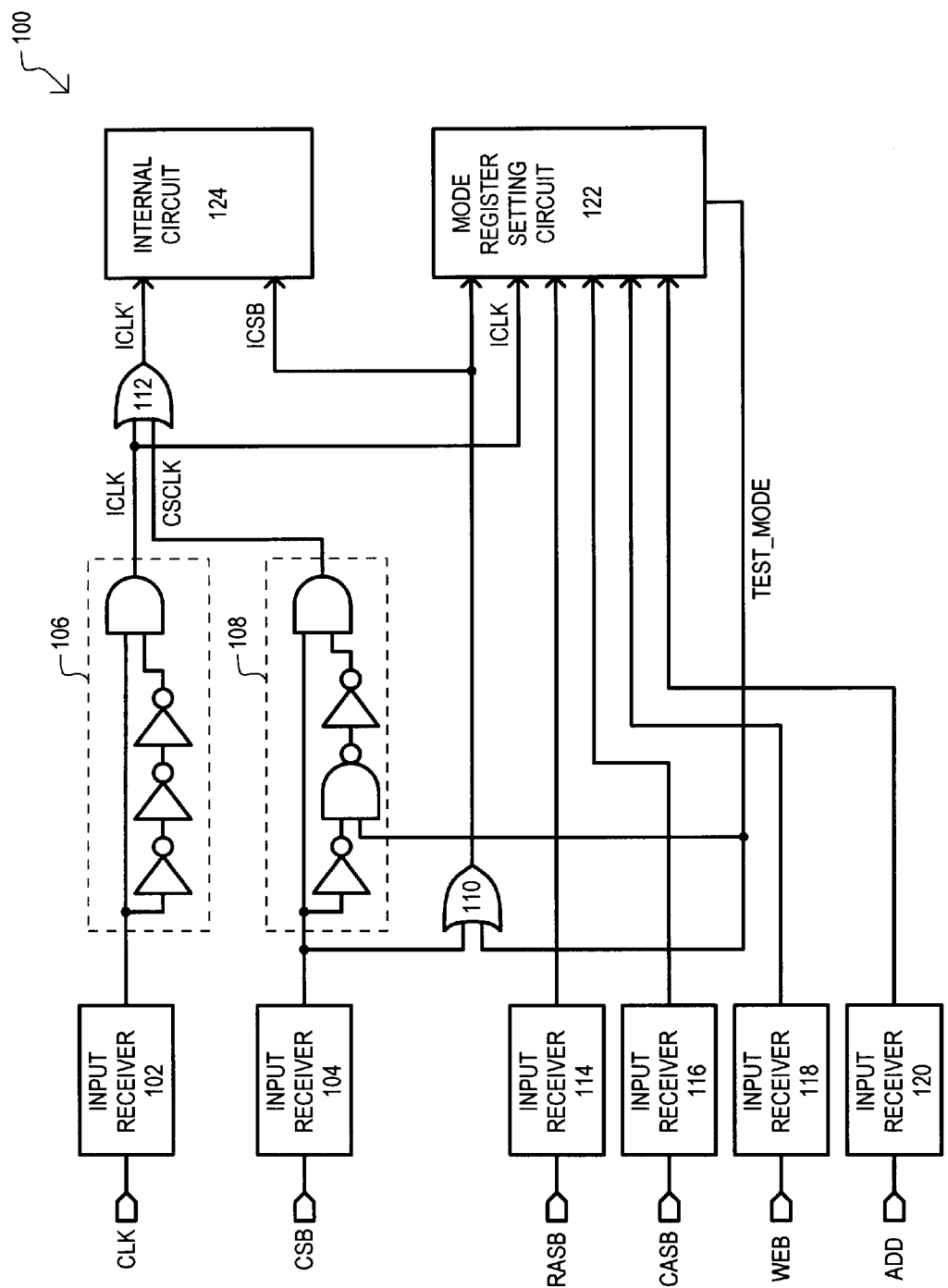
FIG. 1 sets forth the structure of a synchronous semiconductor storage device according to one embodiment.

As shown in FIG. 1, a synchronous semiconductor storage device is designated by the general reference character 100, and is shown to include a first input receiver 102 that can receive an external clock signal CLK, and a second input receiver 104 that can receive an external select clock signal CSB. The first and second input receivers (102 and 104) can receive their respective signals (CLK and CSB), and provide outputs in response thereto.

A pulse generating circuit 106 is coupled to the output of the first input receiver 102. In response to predetermined synchronous transitions in the output of the first input receiver 102, the pulse generating circuit 106 can provide an internal synchronous clock signal ICLK. In a similar fashion, in response to predetermined synchronous transitions in the output of the second input receiver 104, the pulse generating circuit 108 can provide a different internal synchronous clock signal CSCLK.

The embodiment of FIG. 1 is shown to further include an OR gate 110 that can output an internal synchronous control signal ICSB. The ICSB signal can correspond to the CSB signal applied to the second input receiver 104. In the particular arrangement of FIG. 1, OR gate 110 has one input coupled to the output of second input receiver 104 and a second input coupled to a test mode activating signal (TEST_MODE).

A third internal synchronous clock signal ICLK' is provided by another OR gate 112. OR gate 112 receives the ICLK signal as one input and the CSCLK signal as another input. In this way, the ICLK' signal can represent a combination of multiple clock signals (ICLK and CSCLK).

The first embodiment 100 includes a number of other input receivers for receiving various control signals. A third input receiver 114 can receive a first external control signal RASB, a fourth input receiver 116 can receive a second external control signal CASB, and a fifth input receiver 118 can receive a third external control signal WEB. Also included is a sixth input receiver 120 that can include a plurality of receivers that receive a plurality of address signals ADD.

The outputs of the input receivers 114, 116, 118 and 120 are coupled to a mode register setting circuit 122. The mode register setting circuit 122 also receives the ICSB and ICLK signals. The mode register setting circuit 122 provides the TEST_MODE signal as an output. The TEST_MODE signal can be activated by applying predetermined signals to the mode register setting circuit 122. For example, the TEST_MODE signal may be activated by applying the outputs from the third through sixth input receivers (114 to 120) along with and the ICSB signal and an ICLK signal rising edge.

An internal circuit 124 receives the ICSB and ICLK' signals, and operates in response thereto.

In the particular arrangement of FIG. 1, pulse generator circuits (106 and 108) include a delay path (that includes inverters in series) and a non-delay path, which are provided as inputs to a logic gate. This arrangement should not be construed as limiting to the invention. Other pulse generator circuits could be employed. It is further noted that pulse generator circuit 108 can be enabled and disabled by the TEST_MODE signal. In the particular arrangement of FIG. 1 this is accomplished by including a logic gate in the delay path that receives the TEST_MODE signal as an input.

Having described portions of the embodiment 100 of FIG. 1, the operation of the embodiment 100 will now be described in conjunction with a timing diagram set forth in FIG. 2. FIG. 2 illustrates the response of the CLK, CSB, ICLK, CSCLK, ICLK', RASB, CASB, WEB and ADD signals, prior to a test mode, as well as after a test mode has been entered. As set forth in FIG. 2, prior to a test mode being entered, when the CLK signal transitions from a low level to a high level, the ICLK signal pulses high. Further, when in a non-test mode, pulse generator 108 is disabled, thus the CSCLK signal does not pulse high. As a result, the ICLK' signal follows from the CLK signal, and therefore does not include a "double" clock frequency that can be advantageous in a test mode.

Figure 2:
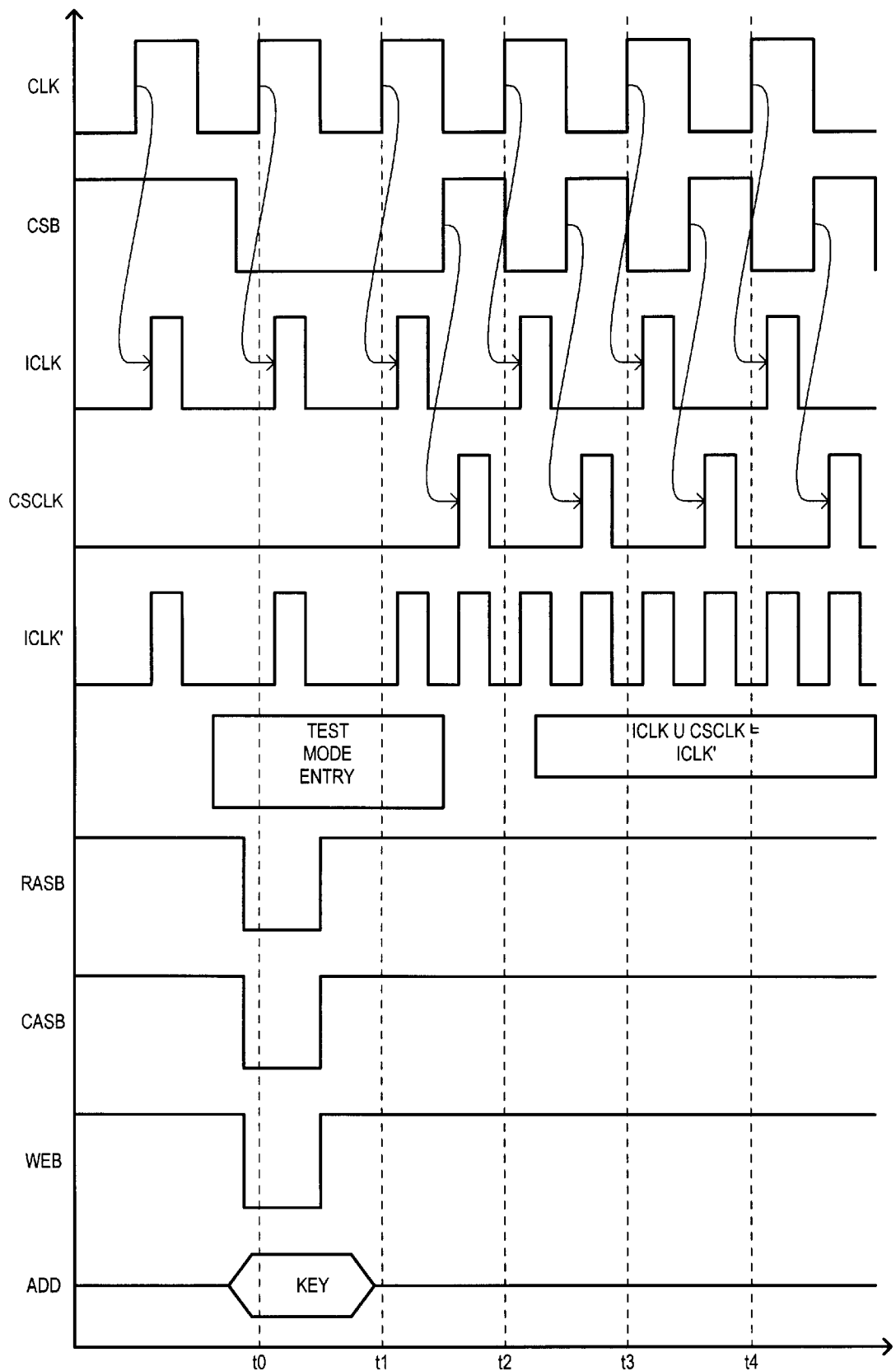
FIG. 2 is a timing diagram illustrating the operation of the synchronous semiconductor storage device of FIG. 1.

At time t0 of FIG. 2, a test mode is entered. The test mode is entered by the CSB signal first transitioning low. On a following rising edge of the CLK signal, the RASB, CASB, and WEB signals are low. Further, a particular code (KEY) is applied by the ADD signals to designate a test mode.

After entry into the test mode is made, the CSB signal can periodically transition from low to high. In response to the low-to-high transitions, the CSCLK signal pulses high. When either one of the ICLK signal or CSCLK signal transitions high, the ICLK' signal will transition high. In this way, the first embodiment 100 includes clock signal generators that can provide internal clocks signals that are synchronous with external clock signals. Further, a test clock signal (such as the CSB signal) can be used in conjunction with a standard clock signal (such as the CLK signal) to provide clock "multiplication." It is understood that the term clock multiplication is not intended to mean a particular mathematical operation, but rather the generation of a clock signal (such as the ICLK' signal) having a higher frequency than a standard clock signal (such as CLK). In the particular arrangement of FIG. 1, clock multiplication is accomplished by providing an internal clock signal ICLK' that has transitions corresponding to the transitions of multiple other clock signals (such as CLK and CSB). As just one example, in FIG. 1, OR gate 112 provides multiplied clock signal (ICLK') by essentially combining the ICLK and CSCLK signals.

It is further noted that a "test clock" signal can advantageously be generated by an input signal that does not typically transmit a synchronous clock signal (such as a CSB input signal or DQM input signal, as will be described below).

Conventional approaches have initialized a device by executing a mode register setting command after applying power to the device. As noted previously, if test mode values are applied to a mode register circuit by a "double frequency" clock CLK', incorrect mode register values can be latched. The described embodiments can overcome this problem by applying the ICLK signal (as opposed to the ICLK' signal) to the mode register setting circuit. As shown in FIG. 2, the ICLK signal is driven only by the CLK signal. Consequently, a mode register setting circuit of the first embodiment can avoid the latching incorrect values by a clock signal that follows the application of the mode setting values.

Figure 3:
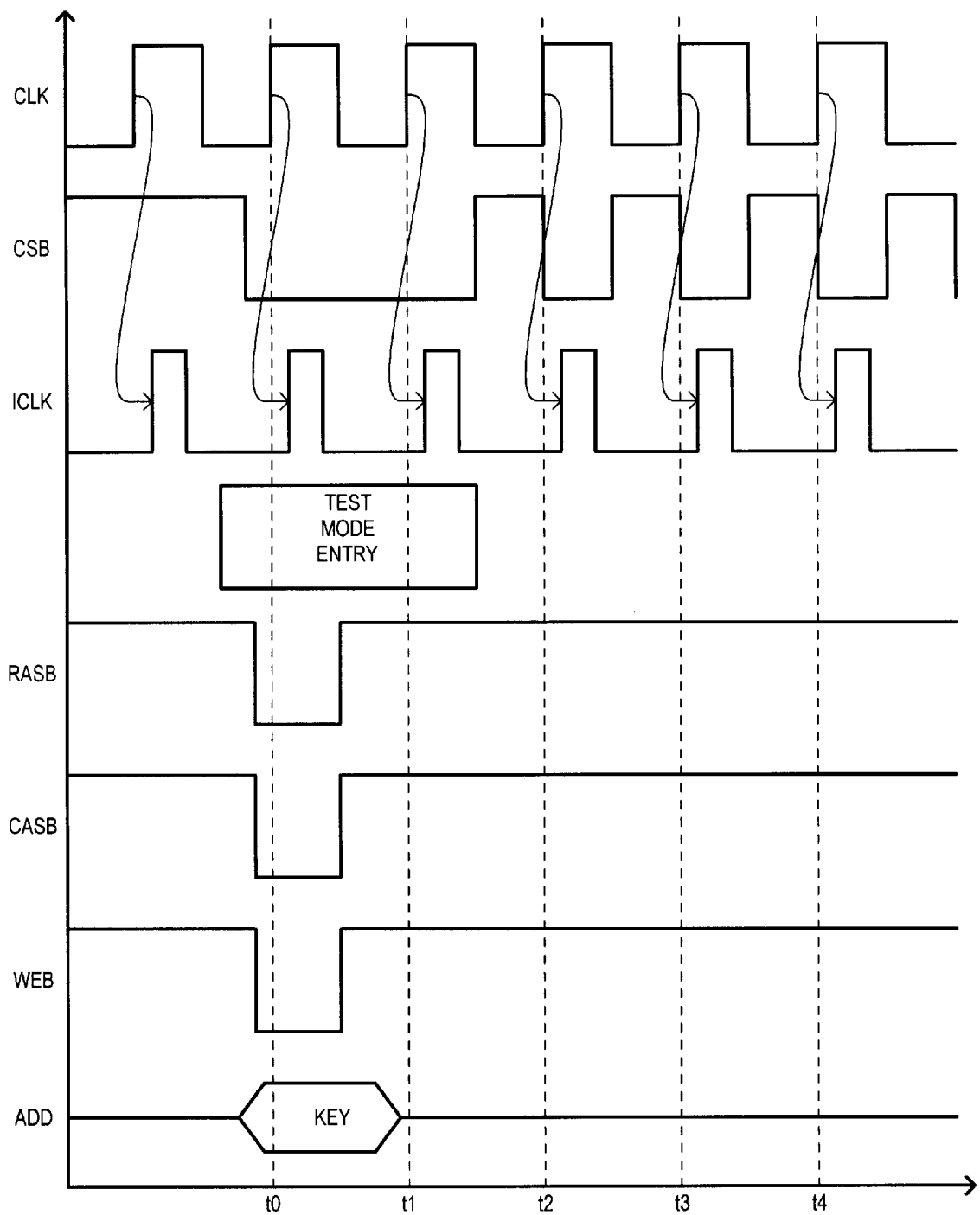
FIG. 3 is a timing diagram illustrating the operation of a mode register setting circuit.

The advantageous mode latching approach of the first embodiment 100 can be best understood with reference to FIG. 3. As shown in FIG. 3, a mode setting command can be applied by the CLK signal shifting LOW to HIGH at time t0, thus generating an ICLK signal pulse. At the same time, the plurality of external signals RASB, CASB, WEB, and CSB are set to LOW levels, and the ADD values are set to a test mode KEY value. By latching mode setting values according to the slower ICLK signal and not the potentially faster ICLK' signal, the first embodiment 100 can be placed into a test mode of operation, without the possible drawbacks of conventional approaches.

Referring once again to FIG. 1 in conjunction with FIGS. 2 and 3, it is noted that when the test mode activating signal (TEST_MODE) becomes the HIGH level, due to the low CSB level, the CSCLK signal is fixed to the LOW level. The CSB signal can be a "chip select" input signal that selects one synchronous semiconductor storage device from a number of such devices. Chip selection is generally not required when single synchronous semiconductor storage devices are tested. Thus, after the test mode has been entered, the logic generated by a CSB signal in a normal mode of operation can be maintained at a predetermined level in order to maintain a device in a selected state. As just one example, the chip select logic applied to a command decoder can be maintained at a logic LOW once the test mode is entered. In this way, transitions in a chip select signal (such as CSB) used to generate an internal clock signal will not "de-select" the device under test, as internal circuits will receive logic equivalent to a CSB signal having a constant value.

It is noted that while FIGS. 1 to 3 set forth a particular arrangement for multiplying a clock signal, other arrangements can be used with the disclosed embodiments. As just one example, it is also possible to generate the ICLK signal from a transition in the CLK signal and a transition in a DQM signal. The DQM signal can be an external signal normally provided in some synchronous semiconductor storage devices, that has the function of "masking" the data output from, or input to, a device. Like the CSB signal, the DQM signal an be a signal that can have a fixed level in a test mode. Thus, a doubling of an internal clock frequency is possible utilizing a CLK and DQM signal.

It is further noted that an internal synchronous signal can be generated from more than two externally applied signals. As just one example, an internal clock signal can be generated from the CSB, CLK and the DQM signal during a test mode. In such an arrangement, it is possible to generate an internal synchronous signal at a frequency that is three times a CLK signal provided by a tester. This can provide for even faster test speeds.

Having described the general constituents and operation of one particular embodiment, another embodiment will now be described in conjunction with FIGS. 4 and 5.

Many synchronous semiconductor storage devices rely on precharge operations to speed up memory accesses. As just one example, data may be carried on complementary conductive lines. Such line pairs can be precharged to the same level during a precharge operation, making the sensing of data on the line pairs easier to detect, faster, and less costly in terms of current consumption. Precharge operations can be contrasted with active operations. Active operations can access memory locations, and can include read and write operations (for volatile devices), as well as read, program and erase operations (from many non-volatile devices). Typical accesses to a synchronous semiconductor storage device can thus include alternating between active and precharge operations (cycles). The second embodiment described by FIGS. 4 and 5 can provide advantageous testing speeds for those devices which have active and precharge operations, such as a synchronous semiconductor storage device.

Figure 4:
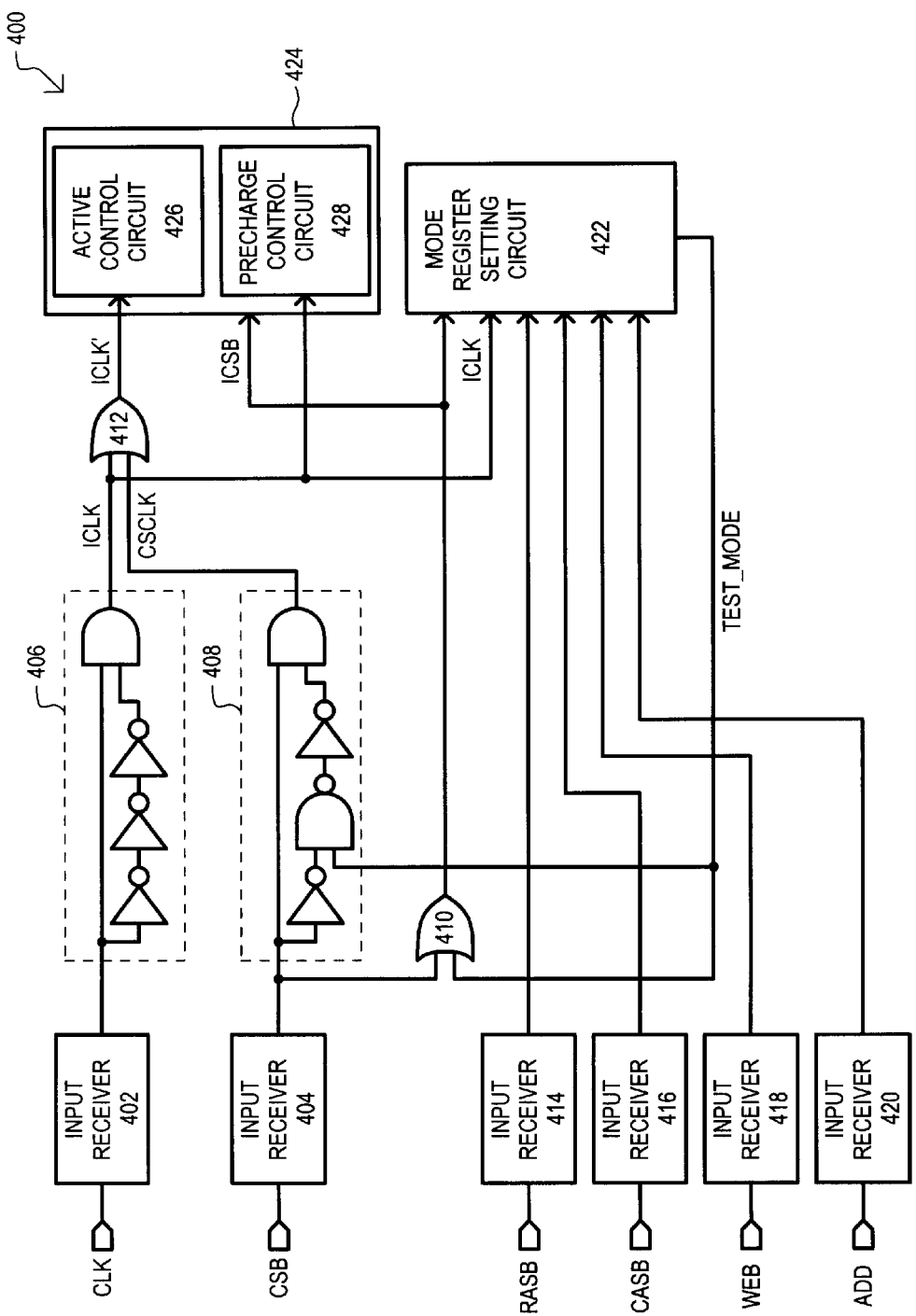
FIG. 4 sets forth the structure of a synchronous semiconductor storage device according to another embodiment.

Referring now to FIG. 4, the second embodiment is shown to be a synchronous semiconductor storage device, and is designated by the general reference character 400. The synchronous semiconductor storage device 400 is shown to include a first input receiver 402 that receives an external clock signal CLK, a second input receiver 404 that receives an external select clock signal CSB, a pulse generating circuit 406 that outputs an internal synchronous clock signal ICLK by receiving an output from the first input receiver 402, and a pulse generating circuit 408 that outputs an internal synchronous select signal CSCLK by receiving an output of the second input receiver 404.

Also shown in FIG. 4 is an OR gate 410 that outputs an internal synchronous control signal ICSB, and an OR gate 412 that receives the ICLK and CSCLK signals, and outputs an ICLK' signal.

A number of other input receivers are illustrated. A third input receiver 414 receives a first external control signal RASB, a fourth input receiver 416 receives a second external control signal CASB, a fifth input receiver 418 receives a third external control signal WEB. A sixth input receiver 420 can include a plurality of receivers that receive a plurality of address signals. A mode register setting circuit 422 can output a test mode activating signal (TEST_MODE) according to predetermined outputs from the third through sixth input receivers (414 to 420) and the ICSB and ICLK signals.

The embodiment of FIG. 4 is shown to further include an internal circuit 424 that receives the ICSB signal. The internal circuit 424 is shown to also include an active control circuit 426 that receives the ICLK' signal, and a precharge control circuit 428 that receives the ICLK signal.

The operation of the second embodiment 400 will now be described. In the second embodiment 400 certain functions are accomplished by the application of particular clock and control signals. For example, an active command (which can result in an active operation) or a precharge command (which can result in a precharge operation) can be entered by certain combinations of the CSB, RASB, CASB, WEB and CLK signals. As illustrated by FIG. 5, when the CLK signal transitions from the LOW level to the HIGH level, and the RASB and WEB signals are set to LOW and the CASB signal is set to HIGH, a precharge command will be entered. The time indication for a first cycle (Cl) thus denotes a precharge cycle.

While active cycles can follow a precharge cycles, such approaches typically rely on the application of at least one control signal value (such as a low CASB value) in conjunction with a high-to-low transition in the standard clock signal CLK. However, due to slow CLK speeds in testers, such an approach is not desirable.

Figure 5:
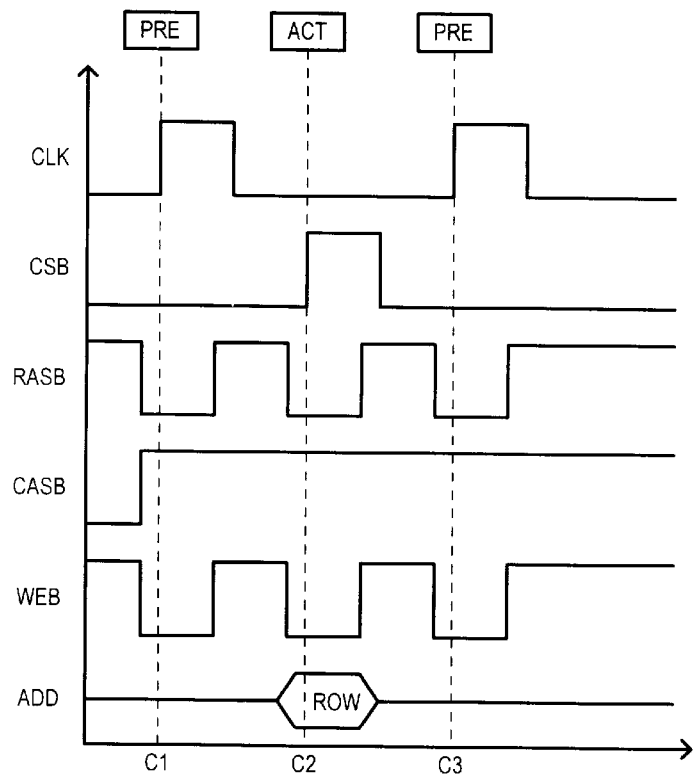
FIG. 5 is a timing diagram illustrating the operation of the synchronous semiconductor storage device of FIG. 4.
Figure 7:
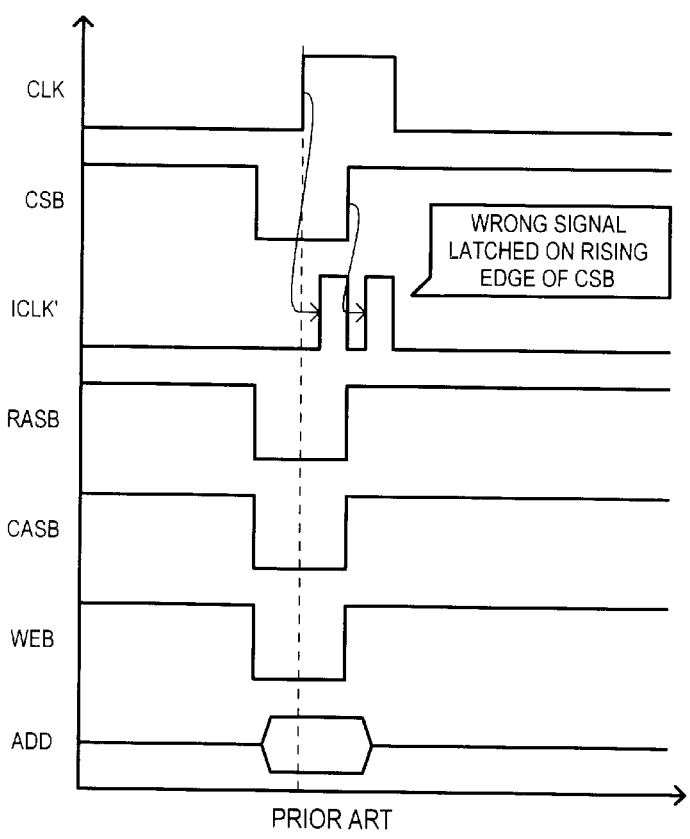
FIG. 7 a timing diagram illustrating the operation of the conventional synchronous semiconductor storage device of FIG. 6.
Figure 6:
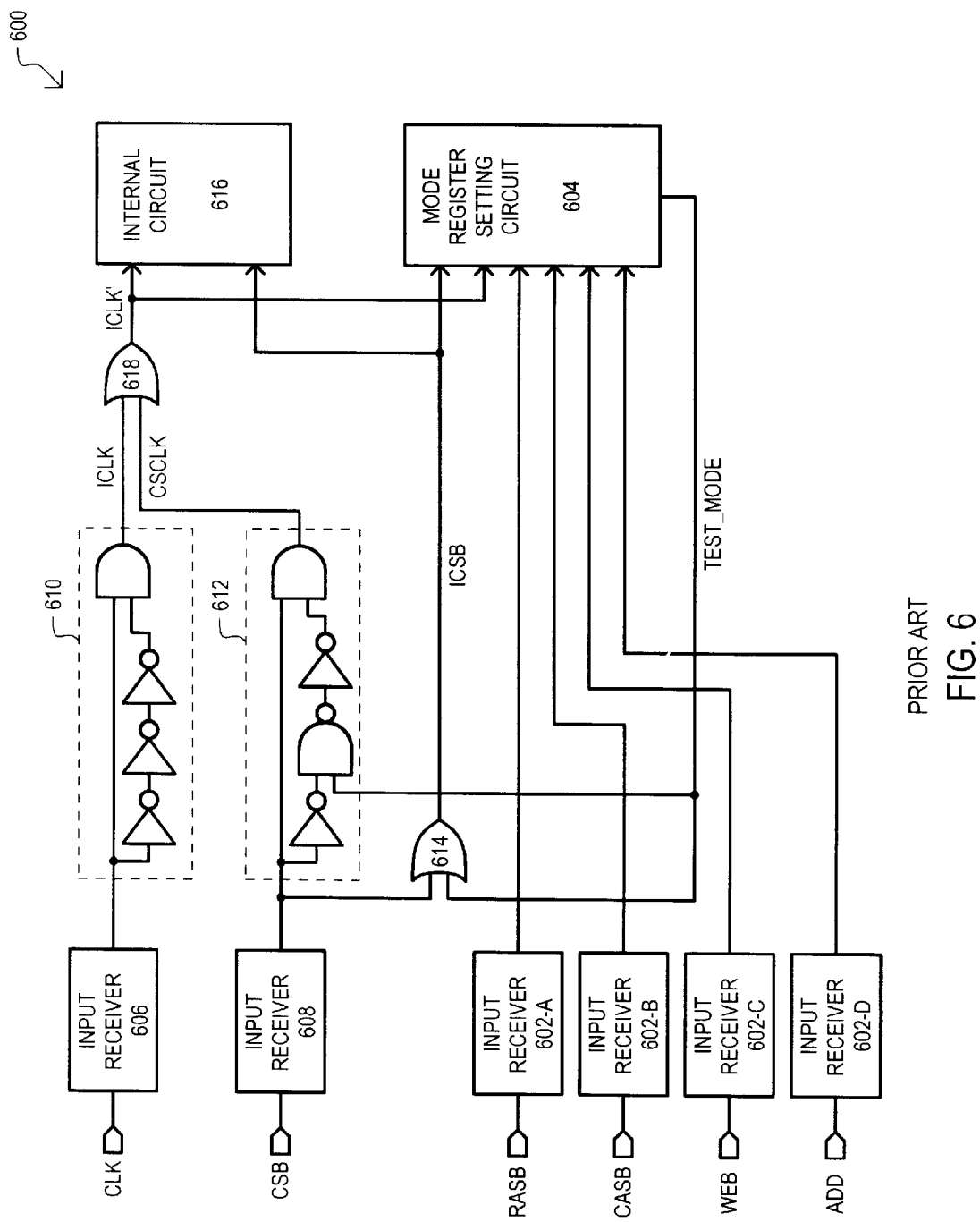
FIG. 6 sets forth the structure of a conventional synchronous semiconductor storage device.

FIG. 5 illustrates how the second embodiment can advantageously enter an active cycle in a test mode. Once a test mode has been entered, when the CSB signal transitions from the LOW level to the HIGH level, and the RASB and WEB signals are set to LOW and the CASB signal is set to HIGH, an active command will be entered. In this way precharge and active commands can be entered into a device at twice the frequency of the external clock signal, essentially doubling the frequency of the device.

In this way, in a test mode, the ICLK' signal will be applied to the active control circuit 426 allowing the circuit to operate at twice the CLK frequency. At the same time, in a test mode, the precharge control circuit 428 can provide complementary precharge operations in response to the slower ICLK signal. Such an arrangement can advantageously reduce the amount of wiring required for routing ICLK' signal. Reductions in wiring can lead to more compact integrated circuit arrangements, less complexity in wire routing, and/or greater ease in laying out the various portions of an integrated circuit.

The embodiments described have set forth synchronous semiconductor storage devices that can generate advantageously fast internal clocks during a test mode of operation. By increasing internal clock speed, the low clock speed provided by tester devices can be overcome, resulting in an overall reduction in test cycle time. Decreases in cycle time can reduce manufacturing costs and/or allow devices to be supplied to customers in larger volumes in a shorter amount of time.

Synchronous semiconductor storage devices can take a variety of forms. As just a few examples, a synchronous semiconductor storage device can include volatile memory devices, such as dynamic random access memories (DRAMs) or static RAMs (SRAMs), or non-volatile memory devices, such as read only memories (ROMs), including electrically programmable ROMs (EPROM), electrically erasable programmable ROMs (EEPROMs and "flash" EEPROMs), and ferroelectric RAMs (FRAMs), to name just a few limited examples.

Memory devices may particularly benefit from the high speed clocking arrangement taught by the disclosed embodiments, as such devices typically have input signals that are not necessary for the majority of testing operations (such as a chip select signal or data mask signal). Further, memory devices may also particularly benefit from the disclosed increase in cycling between active cycles and precharge cycles, as memory devices often include bit lines and data lines that must be precharged.

It is understood, however, that the teachings set forth herein are not necessarily limited to storage devices. Other devices having high speed accesses that are tested by slower testing devices (such as bum-in testers) can benefit from the higher test speed and more accurate mode entry approaches set forth. As just one limited example, programmable circuits, such as programmable logic devices (PLDs) and programmable logic arrays (PLAs) could have improved testing speeds.

It is further noted that "external" signals are not necessarily limited to signals applied externally to an integrated circuit package. As just one example, a semiconductor storage device may be one portion of a larger integrated circuit (so called "integrated memory"). In such an arrangement, external clock signals could be generated by an "on-chip" memory control circuit.

Accordingly, it is understood that while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A synchronous semiconductor storage device, comprising:

a first input receiver that can receive a first external clock signal and provide a first input receiver output;

a second input receiver that can receive a second external clock signal and provide a second input receiver output;

a logic gate that generates a modified internal synchronous signal in response to at least the first input receiver output and the second input receiver output;

a mode register setting circuit that generates a test mode activating signal in synchronism with the first input receiver output; and an internal circuit that receives the modified internal synchronous signal.

2. The synchronous semiconductor storage device according to claim 1, wherein:
the modified internal synchronous signal has at least a first speed when the test mode activating signal is inactive and at least a second speed when the test mode activating signal is active, the second speed being faster than the first speed.

3. The synchronous semiconductor storage device according to claim 1, wherein:
the internal circuit includes a first portion and a second portion, the first portion and second portion operating synchronously with the first input receiver output when the test mode activating signal is inactive, the first portion operating synchronously with the first input receiver output and the second portion operating synchronously with the modified internal synchronous signal when the test mode activating signal is active.

4. The synchronous semiconductor storage device according to claim 1, wherein:
the synchronous semiconductor storage device can receive at least an active command and a precharge command; and
the internal circuit includes
an active control circuit that controls a first portion of the internal circuit in response to an active command, the active control circuit operating in synchronism with the modified internal synchronous signal in a test mode, and
a precharge control circuit that controls a second portion of the internal circuit in response to a precharge command, the precharge control circuit operating in synchronism with the first input receiver output in a test mode.

5. The synchronous semiconductor storage device according to claim 1, wherein:
a first pulse generating circuit that can receive the first input receiver output and provide a first internal synchronous signal therefrom;
a second pulse generating circuit that can receives the second input receiver output and provide a second internal synchronous signal therefrom; and
the logic gate generates the modified internal synchronous signal in response to the first internal synchronous signal and the second internal synchronous signal.

6. The synchronous semiconductor storage device according to claim 1, wherein:
the internal circuit can be controlled according to the output of the second input receiver when the test mode activating signal is inactive, the internal circuit being controlled independent of the output of the second input receiver when the test mode activating signal is active.

7. The synchronous semiconductor storage device according to claim 1, wherein:
the second input receiver device can receive a chip select signal that can select the synchronous semiconductor storage device to receive a command input.

8. The synchronous semiconductor storage device according to claim 1, wherein:
the second input receiver device can receive a data mask signal that can mask data values input to or output from the synchronous semiconductor storage device.

9. A semiconductor device that operates in synchronism with a clock signal, the semiconductor device comprising:
a first signal generator that provides a first internal synchronous clock signal from the clock signal;
a second signal generator that provides a second internal synchronous clock signal from a test clock signal, the second signal generator being enabled by an active test mode signal;
a clock multiplier that can combine at least the first internal synchronous clock signal and the second internal synchronous clock signal to generate a third internal synchronous clock signal; and
a mode setting circuit that provides the test mode signal, the mode setting circuit activating the test mode signal in response to the application of predetermined mode values and a transition in the first internal synchronous clock signal.

10. The semiconductor device of claim 9, wherein:
the first signal generator includes a pulse generator that provides a pulse according to predetermined transitions in the clock signal.

11. The semiconductor device of claim 9, wherein:
the second signal generator includes a pulse generator that provides a pulse according to predetermined transitions in the test clock signal when enabled.

12. The semiconductor device of claim 11, wherein:
the second signal generator includes a logic gate with one input coupled to the test mode signal.

13. The semiconductor device of claim 9, wherein:
the semiconductor device is a memory device; and
the predetermined mode values include predetermined address values.

14. The semiconductor device of claim 9, further including:
a third signal generator that provides a fourth internal synchronous clock signal from an additional test clock signal; and
the clock multiplier combines the first internal synchronous clock signal, the second internal synchronous clock signal, and the fourth internal synchronous clock signal to generate the third internal synchronous clock signal.

15. A synchronous storage device having a test mode and a non-test mode, the synchronous storage device comprising:
a clock generating circuit that receives at least one clock signal and provides a multiplied clock signal that can include more signal transitions in a time period than the at least one clock signal in the test mode; and
a test mode register setting circuit that can enable the test mode and the non-test mode according to predetermined mode values and a transition in the at least one clock signal.

16. The synchronous storage device of claim 15, wherein:
the clock generating circuit receives the at least one clock signal and a test clock signal and provides a multiplied clock signal having transitions corresponding to transitions in the at least one clock signal and test clock signal.

17. The synchronous storage device of claim 15, further including:
an internal circuit having a first portion that operates synchronously with the multiplied clock signal in the test mode, and operates synchronously with the at least one clock signal in the non-test mode.

18. The synchronous storage device of claim 17, wherein:
the internal circuit includes a second portion that operates synchronously with the at least one clock signal in both the test and non-test modes.

19. The synchronous storage device of claim 18, wherein:

the synchronous storage device is a memory device;

the first portion is an active control circuit for enabling active cycles in the memory device; and the second portion is a precharge control circuit for enabling precharge cycles in the memory device.

20. The synchronous storage device of claim 18, wherein:

the first portion is coupled to conductive lines that can carry the multiplied clock signal; and the second portion is coupled to conductive lines that carry the at least one clock signal.

* * * * *